United States Patent
Park et al.

(10) Patent No.: US 11,003,395 B2
(45) Date of Patent: May 11, 2021

(54) CONTROLLER, MEMORY SYSTEM, AND OPERATING METHODS THEREOF

(71) Applicant: SK hynix Inc., Gyeonggi-do (KR)

(72) Inventors: Jeen Park, Gyeonggi-do (KR); Jong Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/725,770

(22) Filed: Dec. 23, 2019

(65) Prior Publication Data

US 2021/0011669 A1 Jan. 14, 2021

(30) Foreign Application Priority Data

Jul. 8, 2019 (KR) .................. 10-2019-0082098

(51) Int. Cl.
| | |
|---|---|
| *G06F 3/06* | (2006.01) |
| *G06F 11/10* | (2006.01) |
| *G11C 7/10* | (2006.01) |
| *G11C 11/56* | (2006.01) |

(52) U.S. Cl.
CPC .......... *G06F 3/0679* (2013.01); *G06F 3/0619* (2013.01); *G06F 3/0659* (2013.01); *G06F 11/1068* (2013.01); *G11C 7/1069* (2013.01); *G11C 11/56* (2013.01)

(58) Field of Classification Search
CPC .... G06F 3/0679; G06F 3/0619; G06F 3/0659; G06F 11/1068; G11C 7/1069; G11C 11/56
See application file for complete search history.

(56) References Cited

U.S. PATENT DOCUMENTS

| | | | | |
|---|---|---|---|---|
| 9,251,891 | B1* | 2/2016 | Hu ...................... | G11C 11/5642 |
| 10,878,917 | B2* | 12/2020 | Takeyama ............ | G11C 11/409 |
| 2003/0007384 | A1* | 1/2003 | Shimizu .............. | G11C 11/5621 |
| | | | | 365/185.03 |
| 2008/0175058 | A1* | 7/2008 | Kang ..................... | G11C 16/26 |
| | | | | 365/185.11 |
| 2013/0297986 | A1* | 11/2013 | Cohen ................... | G06F 3/0676 |
| | | | | 714/763 |
| 2014/0040704 | A1* | 2/2014 | Wu ...................... | G06F 11/1068 |
| | | | | 714/773 |
| 2014/0059406 | A1* | 2/2014 | Hyun .................. | G11C 11/5621 |
| | | | | 714/773 |

(Continued)

FOREIGN PATENT DOCUMENTS

KR     1020160044923      4/2016

*Primary Examiner* — Kyle Vallecillo
(74) *Attorney, Agent, or Firm* — IP & T Group LLP (57) ABSTRACT

A memory system includes a nonvolatile memory device and a controller configured to control the nonvolatile memory device. The nonvolatile memory device includes a first data storage region in which a memory cell stores one-bit data in a first mode and a second data storage region in which a memory cell stores two-bit or more data in a second mode. The controller controls the nonvolatile memory device to perform a read operation on the first data storage region and the second data storage region in the second mode. The controller decodes first data read from the first data storage region, and decodes second data read from the second data storage region. The controller controls the nonvolatile memory device to perform the read operation on the first data storage region in the second mode.

21 Claims, 9 Drawing Sheets

(56) References Cited

U.S. PATENT DOCUMENTS

| | | | |
|---|---|---|---|
| 2015/0193302 A1* | 7/2015 | Hyun | G06F 11/108 |
| | | | 714/764 |
| 2015/0205664 A1* | 7/2015 | Janik | G06F 11/1012 |
| | | | 714/764 |
| 2017/0125110 A1* | 5/2017 | Sankaranarayanan | |
| | | | G11C 11/5642 |
| 2017/0206953 A1* | 7/2017 | Tai | G06F 11/1072 |
| 2019/0042130 A1* | 2/2019 | Vittal Prabhu | G06F 3/0634 |
| 2019/0043566 A1* | 2/2019 | Wu | G06F 11/1048 |
| 2019/0074283 A1* | 3/2019 | Amaki | G11C 16/16 |
| 2020/0143891 A1* | 5/2020 | Takeyama | G11C 11/409 |
| 2020/0234776 A1* | 7/2020 | Yamada | G11C 16/3459 |

* cited by examiner

CONTROLLER, MEMORY SYSTEM, AND OPERATING METHODS THEREOF

CROSS-REFERENCES TO RELATED APPLICATION

The present application claims priority under 35 U.S.C. § 119(a) to Korean application number 10-2019-0082098, filed on Jul. 8, 2019, which is incorporated herein by reference in its entirety.

BACKGROUND

1. Technical Field

Various embodiments may generally relate to a semiconductor device, and more particularly, to a controller, a memory system including the same, and operating methods thereof.

2. Related Art

In recent years, the paradigm for computer environments changed to ubiquitous computing which may use computer systems virtually anytime and anywhere. As a result, the use of portable electronic apparatuses such as a mobile phone, a digital camera, and a laptop computer has been increasing rapidly. Generally, portable electronic apparatuses use memory systems that employ memory devices. Memory systems may be used to store data used in the portable electronic apparatuses.

Memory systems using memory devices have no mechanical driving units, exhibit good stability and endurance, a fast information access rate, and low power consumption. Such memory systems may include a universal serial bus (USB) memory device, a memory card having various interfaces, a universal flash storage (UFS) device, a solid state drive (SSD), and the like.

SUMMARY

Embodiments of the present disclosure are provided which are capable of improving interleaving performance of a memory system.

In an embodiment of the present disclosure, a memory system may include: a nonvolatile memory device; and a controller configured to control the nonvolatile memory device. The nonvolatile memory device may include a first data storage region in which a memory cell stores one-bit data in a first mode and a second data storage region in which a memory cell stores two-bit or more data in a second mode. The controller may control the nonvolatile memory device to perform a read operation on the first data storage region and the second data storage region in the second mode. The controller may decode, as data of the first mode, first data read from the first data storage region through the read operation, and decode, as data of the second mode, second data read from the second data storage region through the read operation. The controller may control the nonvolatile memory device to perform the read operation on the first data storage region in the second mode by changing any one of a plurality of read voltages for reading the data of the second mode to a read voltage value for reading the data of the first mode.

In an embodiment of the present disclosure, a controller which controls a nonvolatile memory device may include: a processor configured to control the nonvolatile memory device to perform a read operation, in a second mode, on a first data storage region in which a memory cell stores one-bit data in a first mode, and a second data storage region in which a memory cell stores two-bit or more data in the second mode; and an error correction code (ECC) engine configured to decode, as data of the first mode, first data read from the first data storage region through the read operation and decode, as data of the second mode, second data read from the second data storage region through the read operation. The processor may control the nonvolatile memory device to perform the read operation on the first data storage region in the second mode by changing any one of a plurality of read voltages for reading the data of the second mode to a read voltage value for reading the data of the first mode.

In an embodiment of the present disclosure, an operating method of a memory system which includes a nonvolatile memory device and a controller configured to control the nonvolatile memory device, the method may include: performing, by the nonvolatile memory device, a read operation, in a second mode, on a first data storage region in which a memory cell stores one-bit data in a first mode and a second data storage region in which a memory cell stores two-bit or more data in the second mode; and decoding, by the controller, first data read from the first data storage region through the read operation, as data of the first mode and decoding, by the controller, second data read from the second data storage region through the read operation, as data of the second mode. The read operation may be performed on the first data storage region in the second mode by changing any one of a plurality of read voltages for reading the data of the second mode to a read voltage value for reading the data of the first mode.

In an embodiment of the present disclosure, an operating method of a controller which controls a nonvolatile memory device, the method may include: controlling the nonvolatile memory device to perform a read operation, in a second mode, on a first data storage region in which a memory cell stores one-bit data in a first mode, and a second data storage region in which a memory cell stores two-bit or more data in the second mode; decoding, as data of the first mode, first data read from the first data storage region through the read operation; and decoding, as data of the second mode, second data read from the second data storage region through the read operation. The controlling of the nonvolatile memory device may include controlling the nonvolatile memory device to perform the read operation on the first data storage region in the second mode by changing any one of a plurality of read voltages for reading the data of the second mode to a read voltage value for reading the data of the first mode.

In an embodiment of the present disclosure, an operating method of a controller for controlling a memory device including a first storage region having single-level cells and a second storage region having multiple-level cells, the first and second storage regions sharing a way, the method may include: controlling the memory device to read out, by using one or more among plural read voltages for the multiple-level cell, first and second data respectively from the first and second regions according to a way-interleaving scheme; and error-correcting the first data according to an error correction scheme for the single-level cell and the second data according to an error correction scheme for the multiple-level cell. The controlling may include controlling the memory device to change, to read out the first data during the read out, a selected one of the plural read voltages to a read voltage for the single-level cell. The selected read voltage may be closest, of the plural read voltages, to the read voltage for the single-level cell.

According to an embodiment of the present disclosure, the interleaving performance of a memory system may be improved.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plane illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
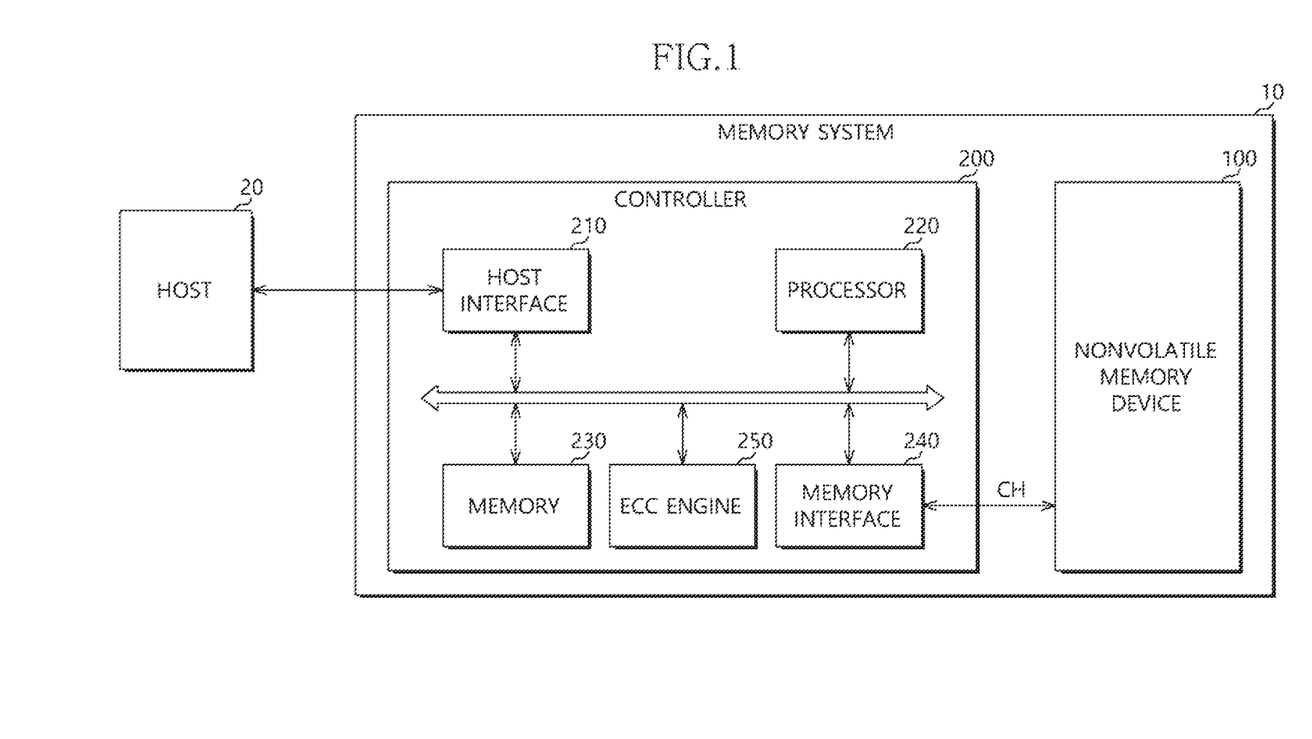
FIG. 1 is a diagram illustrating a configuration of a memory system according to an embodiment of the present disclosure.

FIG. 1 is a diagram illustrating a configuration of a memory system 10 according to an embodiment of the present invention.

Referring to FIG. 1, the memory system 10 according to an embodiment may store data to be accessed by a host 20 such as a mobile phone, an MP3 player, a laptop computer, a desktop computer, a game player, a television (TV), an in-vehicle infotainment system, and the like.

The memory system 10 may be manufactured as any one of various types of storage devices according to an interface protocol coupled to the host 20. For example, the memory system 10 may be configured as any of various types of storage devices, such as a solid state drive (SSD), a multimedia card in the form of MMC, eMMC, RS-MMC, and micro-MMC, a secure digital card in the form of SD, mini-SD, and micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-E) card type storage device, a compact flash (CF) card, a smart media card, a memory stick, and the like.

The memory system 10 may be manufactured as any of various types of packages. For example, the memory system 10 may be manufactured as any of various types of packages, such as a package on package (POP), a system in package (SIP), a system on chip (SOC), a multi-chip package (MCP), a chip on board (COB), a wafer-level fabricated package (WFP), and a wafer-level stack package (WSP).

The memory system 10 may include a nonvolatile memory device 100 and a controller 200.

The nonvolatile memory device 100 may be operated as a storage medium of the memory system 10. The nonvolatile memory device 100 may include any of various types of nonvolatile memory devices according to a memory cell, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase-change random access memory (PRAM) using a chalcogenide alloy, and a resistive random access memory (ReRAM) using a transition metal compound.

Although it has been illustrated in FIG. 1 that the memory system 10 includes one nonvolatile memory device 100, the memory system 10 may include a plurality of nonvolatile memory devices 100 and the present disclosure may be equally applied to the memory system 10 including the plurality of nonvolatile memory devices 100.

The nonvolatile memory device 100 to be described below in detail with reference to FIG. 11 may include a memory cell array 110 including a plurality of memory cells MC arranged in regions in which a plurality of word lines WL1 to WLm and a plurality of bit lines BL1 to BLn cross each other. The memory cell array 110 may include a plurality of memory blocks and each of the plurality of memory blocks may include a plurality of pages.

For example, each of the memory cells in the memory cell array may be a single-level cell (SLC) in which a single bit data (for example, 1-bit data) is to be stored and a multi-level cell (MLC) in which 2-bit or more data is to be stored. The MLC may store 2-bit data, 3-bit data, 4-bit data, and the like. In general, a memory cell in which 2-bit data is to be stored may be referred to as MLC, a memory cell in which 3-bit data is to be stored may be referred to as triple-level cell (TLC), and a memory cell in which 4-bit data is to be stored may be referred to as quad-level cell (QLC). However, the memory cells in which the 2-bit or more bits of data are to be stored may collectively be referred to as the MLC.

The memory cell array 110 may include at least one or more SLC and MLC memory cells. The memory cell array 110 may include memory cells arranged in a two-dimensional (2D) horizontal structure or memory cells arranged in a 3D vertical structure.

The controller 200 may control an overall operation of the memory system 10 by driving firmware or software loaded into a memory 230. The controller 200 may decode and drive a code-type instruction or algorithm such as firmware or software. The controller 200 may be implemented with hardware or a combination of hardware and software.

The controller 200 may include a host interface 210, a processor 220, the memory 230, a memory interface 240, and an error correction code (ECC) engine 250.

The host interface 210 may perform interfacing between the host 20 and the memory system 10 according to a protocol of the host 20. For example, the host interface 210 may communicate with the host 20 through any protocol among a USB protocol, a UFS protocol, an MMC protocol, a parallel advanced technology attachment (PATA) protocol, a serial advanced technology attachment (SATA) protocol, a small computer system interface (SCSI) protocol, a serial attached SCSI (SAS) protocol, a PCI protocol, and a PCI-E protocol.

The processor 220 may be configured of a micro control unit (MCU) and a central processing unit (CPU). The processor 220 may process requests transmitted from the host 20. To process the requests transmitted from the host 20, the processor 220 may drive a code-type instruction or algorithm (for example, firmware) loaded into the memory 230 and control internal function blocks such as the host interface 210, the memory 230, and the memory interface 240 and the nonvolatile memory device 100.

The processor 220 may generate control signals for controlling operations of the nonvolatile memory device 100 based on the requests transmitted from the host 20 and provide the generated control signals to the nonvolatile memory device 100 through the memory interface 240.

The memory 230 may be configured as a random access memory such as a dynamic random access memory (DRAM) or a static random access memory (SRAM). The memory 230 may store the firmware driven through the processor 220. The memory 230 may also store data (for example, metadata) required for driving the firmware. For example, the memory 230 may be operated as a working memory of the processor 220.

In an embodiment, the memory 230 may include regions used for various purposes such as a region in which a flash translation layer (FTL) is to be stored, a region used as a command queue (CMDQ) for queuing commands corresponding to requests provided from the host 20, a region used as a write data buffer in which write data is to be temporarily stored, a region used as a read data buffer in which read data is to be temporarily stored, and a region used as a map cache buffer in which map data is to be cached.

The memory interface 240 may control the nonvolatile memory device 100 according to control of the processor 220. The memory interface 240 may refer to a memory controller. The memory interface 240 may provide control signals to the nonvolatile memory device 100. The control signals may include a command, an address, an operation control signal, and the like for controlling the nonvolatile memory device 100. The memory interface 240 may provide data stored in the data buffer to the nonvolatile memory device 100 or store data transmitted from the nonvolatile memory device 100 in the data buffer.

The ECC engine 250 may generate a parity by performing ECC encoding on write data provided from the host 20 and perform ECC decoding on read data read out from the nonvolatile memory device 100 using the parity.

FIGS. 2A, 2B, 2C and 3 are diagrams describing an operating method of a memory system according to an embodiment.

Figure 2A:
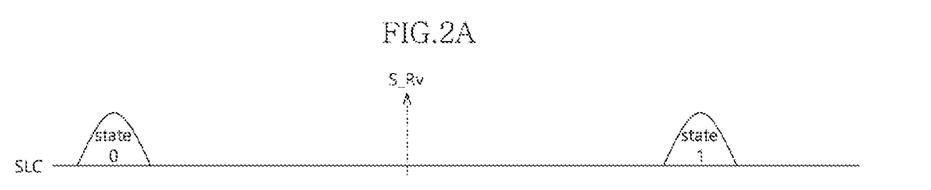
FIGS. 2A, 2B, 2C, 3, 4 and 5 are diagrams for describing an operating method of a memory system according to an embodiment of the present disclosure.
Figure 2B:
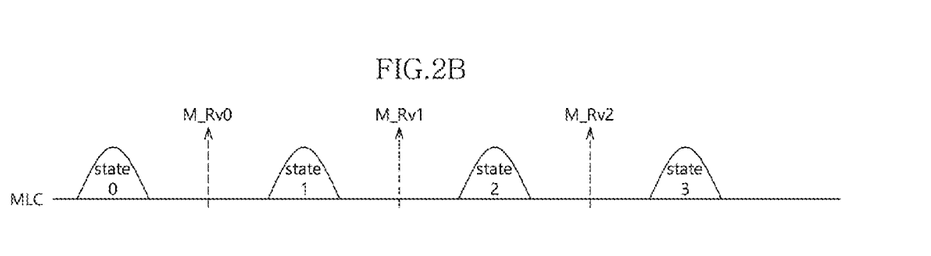
Figure 2C:
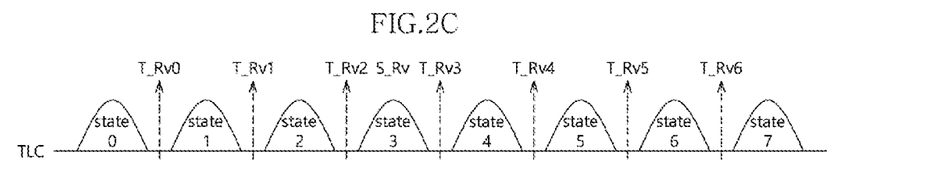

In FIG. 2A illustrates an example of a threshold voltage distribution of a memory cell in a SLC mode in which one memory cell stores one-bit data, FIG. 2B illustrates an example of a threshold voltage distribution of a memory cell in a MLC mode in which one memory cell stores two-bit data, and FIG. 2C illustrates an example of a threshold voltage distribution of a memory cell in a TLC mode in which one memory cell stores three-bit data. Since the threshold voltage distributions may be variously set in a fabrication stage or a usage stage according to a usage purpose, endurance, and the like of the memory system 10, the three examples of threshold voltage distributions illustrated in FIGS. 2A to 2C may be merely exemplary.

Referring to FIGS. 2A to 2C, one read voltage S_Rv may be required to divide two threshold voltage distributions, for example, a first threshold voltage distribution state 0 and a second threshold voltage distribution state 1, in the SLC mode. Three read voltages M_Rv0, M_Rv1, and M_Rv2 may be required to divide four threshold voltage distributions state 0, state 1, state 2, and state 3 in the MLC mode. Seven read voltages T_Rv0, T_Rv1, T_Rv2, T_Rv3, T_Rv4, T_Rv5, and T_Rv6 may be required to divide eights threshold voltage distributions state 0, state 1, state 2, state 3, state 4, state 5, state 6, and state 7 in the TLC mode.

In general, the threshold voltage distribution and the read voltage may be changed according to the number of bits of data to be stored in one memory cell. When the number of bits of data to be stored in the memory cells included in two data storage regions are different from each other, for example, when a first data storage region is programmed in the SLC mode and a second data storage region is programmed in the MLC mode, it may be impossible to simultaneously perform a read operation on the first data storage region and the second data storage region in a way interleaving manner. This is because the controller 200 of the memory system 10 has to control the nonvolatile memory device 100 to perform a read operation in the SLC mode and a read operation in the MLC mode separately from each other.

It can be seen from FIGS. 2A to 2C and FIG. 3 that any one of the read voltages of the MLC mode or the read voltages of the TLC mode may have a value dose to the read voltage of the SLC mode.

Figure 3:
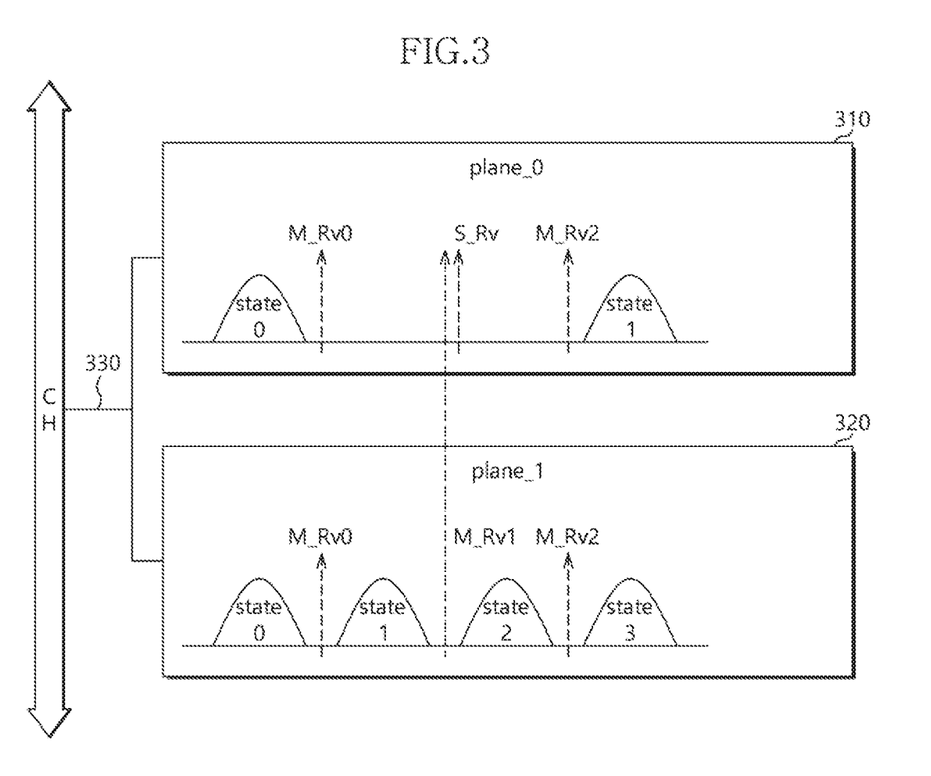

In an embodiment, the nonvolatile memory device 100 may include registers configured to store the read voltage values according to a mode based on data bits stored in the memory cell. The nonvolatile memory device 100 may perform a read operation on the memory cells based on the read voltages stored in the registers in the read operation under control of the controller 200. For example, as illustrated in FIG. 3, the nonvolatile memory device 100 may include first to fourth registers configured to store the read voltages for the MLC mode. In this example, the read voltage M_Rv0 may be stored in the first register, the read voltage M_Rv1 may be stored in the second register, the read voltage M_Rv2 may be stored in the third register, and the read voltage S_Rv for the SLC mode may be stored in the fourth register. The nonvolatile memory device 100 may perform a read operation based on the read voltage S_Rv stored in the fourth register when reading data stored in a memory cell included in a plane plane_0 (for example, first data storage region 310).

Accordingly, referring to FIG. 3, the memory system 10 according to an embodiment may control the nonvolatile memory device 100 to perform a read operation on the first data storage region 310 programmed in the SLC mode by changing any one (for example, the read voltage M_Rv1) of the read voltages of the MLC mode, the TLC, or the like to the value (for example, S_Rv) of the read voltage of the SLC mode and decode the read data, which is a result of the read operation, as data according to the SLC mode (for example, data of the first mode) in response to a read request from the host 20 to the data storage region 310 programmed in the SLC mode. Therefore, the technology of simultaneously performing a read operation on the data storage region 310 programmed in the SLC mode and a data storage region 320 programmed in the MLC mode, the TLC mode, and the like, in a way interleaving manner can be provided.

Figure 4:
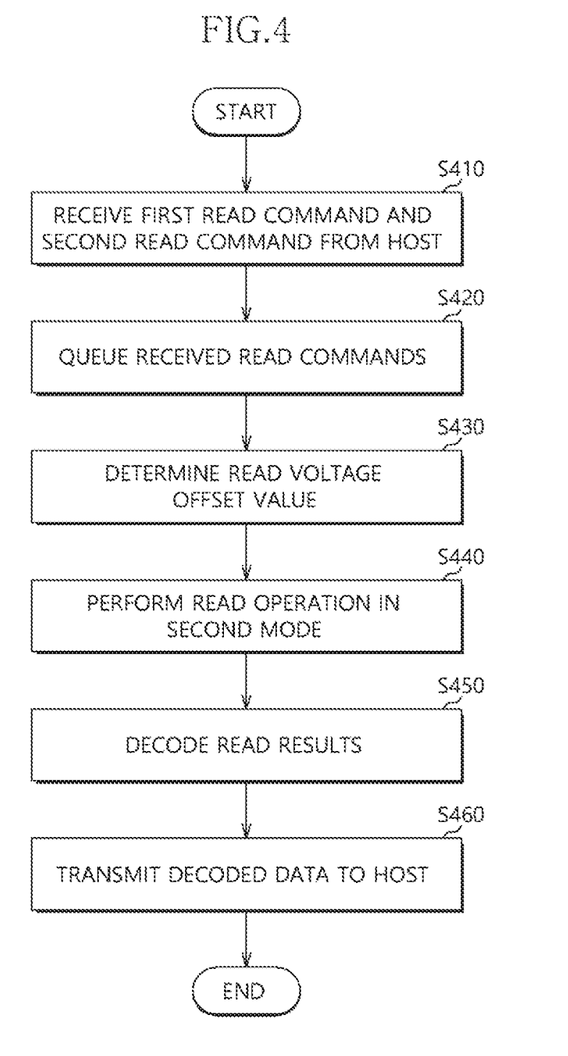
Figure 5:
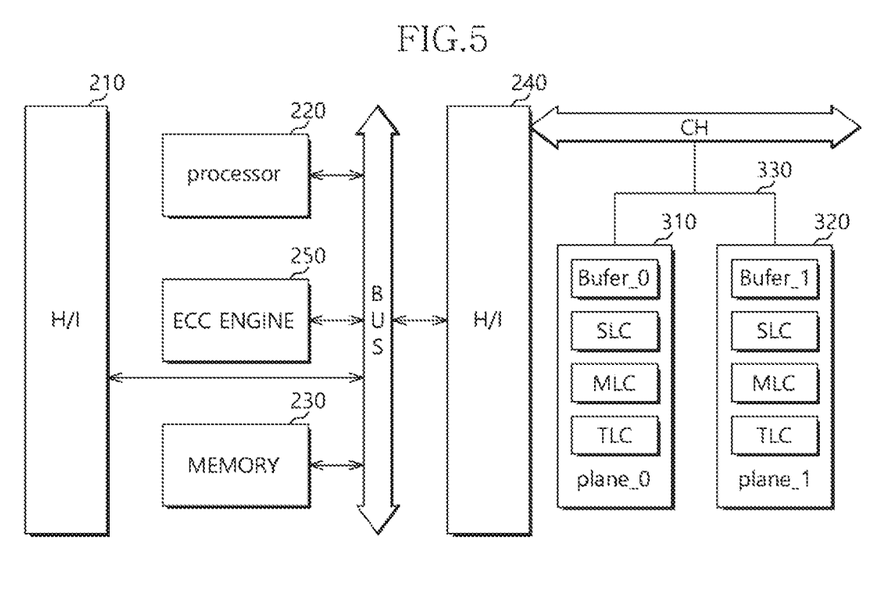

FIGS. 4 and 5 are diagram describing an operating method of a memory system 10 according to an embodiment.

Referring to FIG. 4, in operation 5410, the memory system 10 may receive read commands from the host 20. For example, referring to FIG. 5, the host interface 210 of the controller 200 may receive a first read command and a second read command from the host 20. The host interface 210 may transmit the received read commands to the processor 220 through a bus BUS.

In an embodiment, the first read command may be a read command for the first data storage region 310 (for example, SLC of plane_0) programmed in the first mode (for example, SLC mode) which operates to store one-bit data in one memory cell.

In an embodiment, the second read command may be a read command for the second data storage region 320 (for example, MLC of plane_1) programmed in a second mode (for example, MLC mode, TLC mode, QLC mode, and the like) which operates to store two-bit or more data in one memory cell.

In operation 5420, the memory system 10 may queue the received read commands. For example, referring to FIG. 5, the processor 220 may queue the first read command and the second read command received from the host 20 to simultaneously perform a read operation on the first data storage region 310 (for example, SLC of plane_0) and the second data storage region 320 (for example, MLC of plane_1) in a way interleaving manner.

In operation 5430, the memory system 10 may determine an offset value for changing the read voltage for reading the first data storage region 310 (for example, SLC of plane_0) in the second mode to the read voltage for reading the first data storage region in the first mode. For example, referring to FIG. 5, the processor 220 may determine any one of the read voltages of the second mode as a target to be changed as a read voltage for the read operation of the first mode and determine a difference between the determined read voltage and the read voltage for the read operation of the first mode as the offset value. The processor 220 may transmit a signal, which controls performing a read operation on the first data storage region 310 (for example, SLC of plane_0) and the second data storage region 320 (for example, MLC of plane_1) in the second mode, to the nonvolatile memory device 100 through the memory interface 240. The control signal may include the determined offset value.

In an embodiment, the processor 220 may transmit a signal, which controls performing a read operation on the first data storage region 310 (for example, SLC of plane_0) and the second data storage region 320 (for example, MLC of plane_1) in the way interleaving manner, to the nonvolatile memory device 100.

In operation 5440, the memory system 10 may perform a read operation on the first data storage region 310 (for example, SLC of plane_0) and the second data storage region 320 (for example, MLC of plane_1). For example, referring to FIG. 5, the nonvolatile memory device 100 may read the threshold voltage distributions of memory cells included in the first data storage region 310 (for example, SLC of plane_0) and the second data storage region 320 (for example, MLC of plane_1) based on the read voltages of the second mode in response to the control signal of the processor 220. The nonvolatile memory device 100 may transmit a first read data read from the first data storage region 310 (for example, SLC of plane_0) and a second read data read from the second data storage region 320 (for example, MLC of plane_1), in the second mode, to the memory interface 240 through a channel CH.

In an embodiment, the nonvolatile memory device 100 may perform a read operation on the first data storage region in the second mode by changing any one of the read voltages of the second mode to the read voltage value of the first mode based on the offset value included in the control signal.

In an embodiment, the nonvolatile memory device 100 may simultaneously perform a read operation on the first data storage region 310 (for example, SLC of plane_0) and the second data storage region 320 (for example, MLC of plane_1) according to the control signal of the processor 220 and transmit any one of the first read data and the second read data to the memory interface 240 first and then transmit the other read data to the memory interface 240. This is because the first read data and the second read data may not be simultaneously transmitted to the memory interface 240 due to sharing of one way 330 in the first data storage region 310 and the second data storage region 320.

In operation 5450, the memory system 10 may decode the first and second read data read from the first data storage region 310 (for example, SLC of plane_0) and the second data storage region 320 (for example, MLC of plane_1). For example, referring to FIG. 5, the memory interface 240 may receive the first read data and the second read data from the nonvolatile memory device 100 and transmit the received first and second read data to the ECC engine 250 through the bus BUS. The ECC engine 250 may decode the first read data as the data of the first mode (e.g., data of the SLC mode) and decode the second read data as the data of the second mode (e.g., data of the MLC mode, the TLC mode, the QLC mode or the like).

In an embodiment, the memory 230 may store the decoded data.

In operation 5460, the memory system 10 may transmit the data corresponding to the first read command and the second read command to the host 20. For example, referring to FIG. 5, the memory 230 may receive and store the decoded first and second data from the ECC engine 250 through the bus BUS. The host interface 210 may transmit the data stored in the memory 230 to the host 20.

Figure 6:
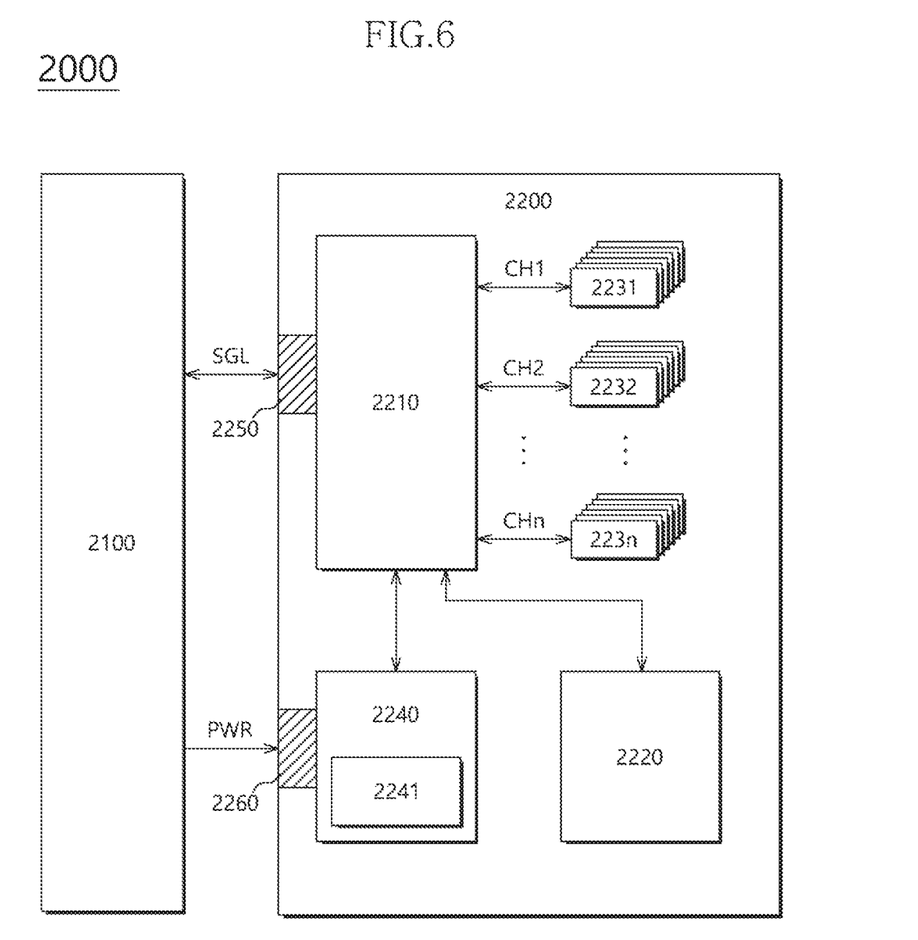
FIG. 6 is a diagram illustrating a data processing system including a solid state drive (SSD) according to an embodiment of the present disclosure.

FIG. 6 is a block diagram illustrating an example of a data processing system including a solid state drive (SSD) according to an embodiment. Referring to FIG. 6, a data processing system 2000 may include a host 2100 and a solid state drive (SSD) 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2200.

The buffer memory device 2220 may temporarily store data which are to be stored in the nonvolatile memory devices 2231 to 223n. Further, the buffer memory device 2220 may temporarily store data which are read out from the nonvolatile memory devices 2231 to 223n. The data temporarily stored in the buffer memory device 2220 may be transmitted to the host 2100 or the nonvolatile memory devices 2231 to 223n according to control of the controller 2210.

The nonvolatile memory devices 2231 to 223n may be used as storage media of the SSD 2200. The nonvolatile memory devices 2231 to 223n may be coupled with the controller 2210 through a plurality of channels CH1 to CHn, respectively. One or more nonvolatile memory devices may be coupled to one channel. The nonvolatile memory devices coupled to one channel may be coupled to the same signal bus and data bus.

The power supply 2240 may provide power PWR inputted through the power connector 2260 to the inside of the SSD 2200. The power supply 2240 may include an auxiliary power supply 2241. The auxiliary power supply 2241 may supply power to allow the SSD 2200 to be normally terminated when sudden power-off (SPO) occurs. The auxiliary power supply 2241 may include large capacity capacitors capable of charging the power PWR.

The controller 2210 may exchange a signal SGL with the host 2100 through the signal connector 2250. The signal SGL may include a command, an address, data, and the like. The signal connector 2250 may be configured of various types of connectors according to an interface scheme between the host 2100 and the SSD 2200.

Figure 7:
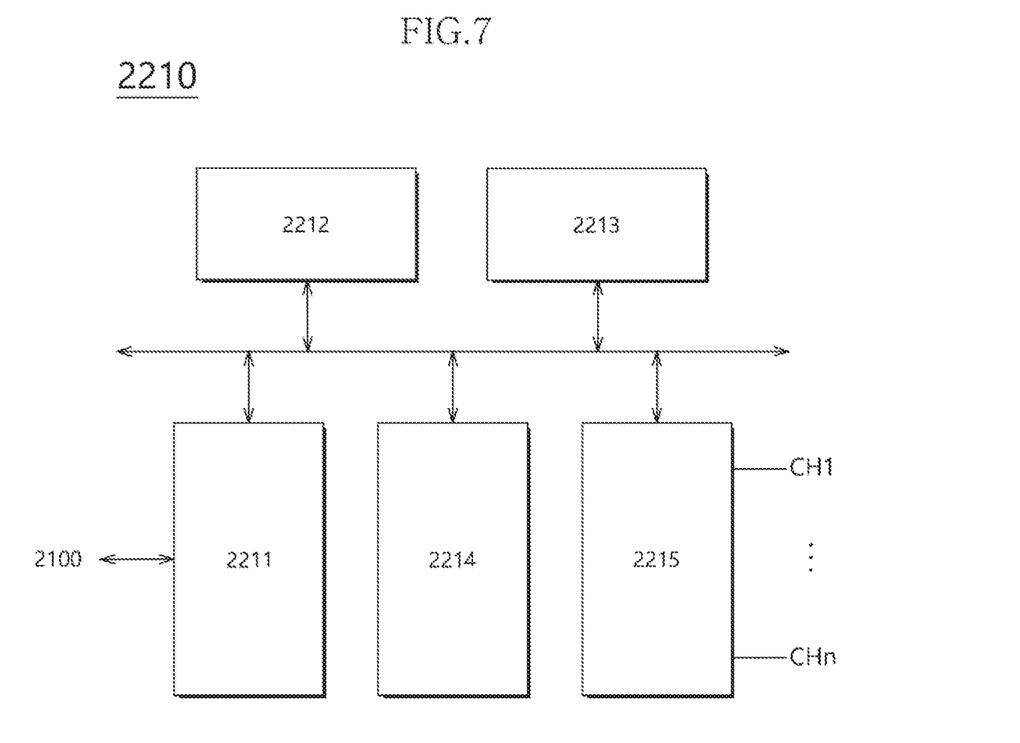
FIG. 7 is a diagram illustrating a configuration of a controller in FIG. 6.

FIG. 7 is a block diagram illustrating an example of the controller illustrated in FIG. 6. Referring to FIG. 7, the controller 2210 may include a host interface unit 2211, a control unit 2212, a random is access memory 2213, an error correction code (ECC) unit 2214, and a memory interface unit 2215.

The host interface unit 2211 may provide interfacing between the host 2100 and the SSD 2200 according to a protocol of the host 2100. For example, the host interface unit 2211 may communicate with the host 2100 through any of SD, USB, MMC, embedded MMC (eMMC), PCMCIA, PATA, SATA, SCSI, SAS, PCI, PCI-E, and UFS protocols. In addition, the host interface unit 2211 may perform a disk emulating function of supporting the host 2100 to recognize the SSD 2200 as a general-purpose memory system, for example, a hard disk drive (HDD).

The control unit 2212 may analyze and process the signal SGL inputted from the host 2100. The control unit 2212 may control operations of internal function blocks according to firmware or software for driving the SSD 2200. The random access memory 2213 may be used as a working memory for driving such firmware or software.

The ECC unit 2214 may generate parity data of data to be transmitted to the nonvolatile memory devices 2231 to 223n. The generated parity data may be stored, along with the data, in the nonvolatile memory devices 2231 to 223n. The ECC unit 2214 may detect errors of data read out from the nonvolatile memory devices 2231 to 223n based on the parity data. When the detected errors are within a correctable range, the ECC unit 2214 may correct the detected errors.

The memory interface unit 2215 may provide control signals such as commands and addresses to the nonvolatile memory devices 2231 to 223n according to control of the control unit 2212. The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read out from the nonvolatile memory devices 2231 to 223n to the buffer memory device 2220.

Figure 8:
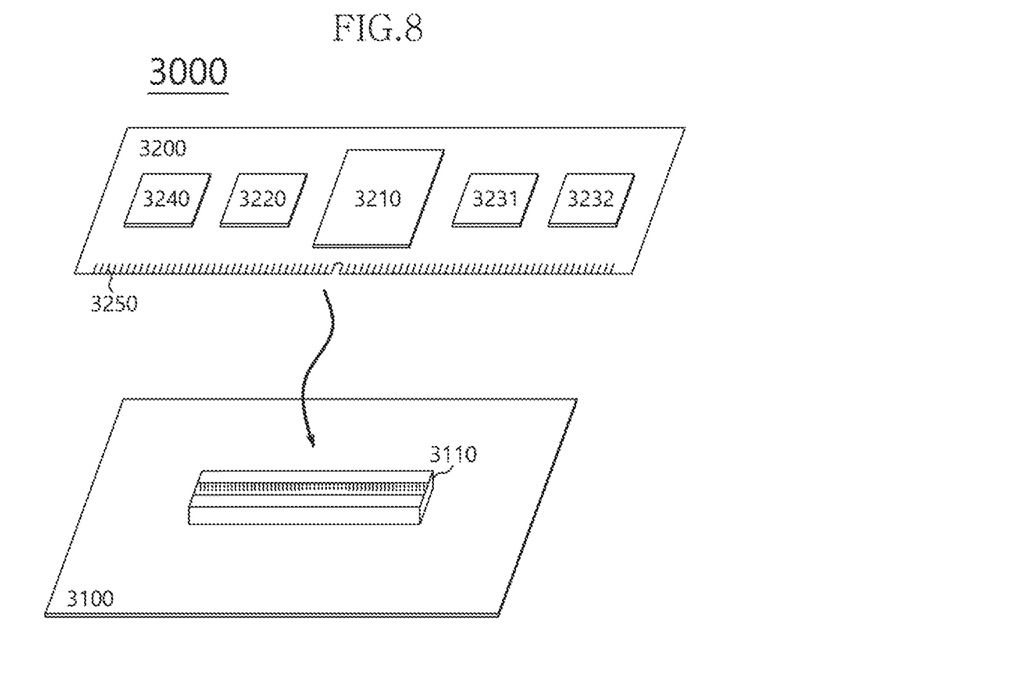
FIG. 8 is a diagram illustrating a data processing system including a memory system according to an embodiment of the present disclosure.

FIG. 8 is a diagram illustrating an example of a data processing system including a memory system according to an embodiment. Referring to FIG. 8, a data processing system 3000 may include a host 3100 and a memory system 3200.

The host 3100 may be configured in the form of a board such as a printed circuit board. Although not shown in FIG. 8, the host 3100 may include internal function blocks for performing functions of the host.

The host 3100 may include a connection terminal 3110 such as a socket, a slot, or a connector. The memory system 3200 may be mounted on the connection terminal 3110.

The memory system 3200 may be configured in the form of a board such as a printed circuit board. The memory system 3200 may refer to a memory module or a memory card. The memory system 3200 may include a controller 3210, a buffer memory device 3220, nonvolatile memory devices 3231 and 3232, a power management integrated circuit (PMIC) 3240, and a connection terminal 3250.

The controller 3210 may control an overall operation of the memory system 3200. The controller 3210 may be configured in the same manner as the controller 2210 shown in FIG. 7.

The buffer memory device 3220 may temporarily store data to be stored in the nonvolatile memory devices 3231 and 3232. Further, the buffer memory device 3220 may temporarily store data read out from the nonvolatile memory devices 3231 and 3232. The data temporarily stored in the buffer memory device 3220 may be transmitted to the host 3100 or the nonvolatile memory devices 3231 and 3232 according to control of the controller 3210.

The nonvolatile memory devices 3231 and 3232 may be used as storage media of the memory system 3200.

The PMIC 3240 may provide power inputted through the connection terminal 3250, to the inside of the memory system 3200. The PMIC 3240 may manage the power of the memory system 3200 according to control of the controller 3210.

The connection terminal 3250 may be coupled to the connection terminal 3110 of the host 3100. Through the connection terminal 3250, signals such as commands, addresses, data and the like, and power may be transferred between the host 3100 and the memory system 3200. The connection terminal 3250 may be configured in various types depending on an interface scheme between the host 3100 and the memory system 3200. The connection terminal 3250 may be disposed on any side of the memory system 3200.

Figure 9:
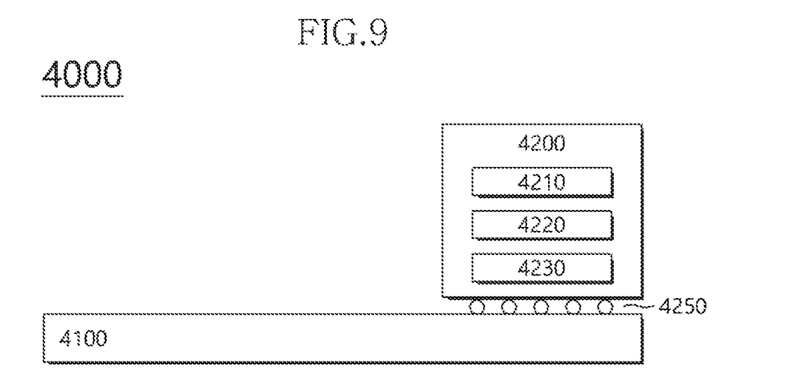
FIG. 9 is a diagram illustrating a data processing system including a memory system according to an embodiment of the present disclosure.

FIG. 9 is a block diagram illustrating an example of a data processing system including a memory system according to an embodiment. Referring to FIG. 9, a data processing system 4000 may include a host 4100 and a memory system 4200.

The host 4100 may be configured in the form of a board such as a printed circuit board. Although not shown in FIG.

9, the host 4100 may include internal function blocks for performing functions of the host.

The memory system 4200 may be configured in the form of a surface-mounting type package. The memory system 4200 may be mounted on the host 4100 through solder balls 4250. The memory system 4200 may include a controller 4210, a buffer memory device 4220, and a nonvolatile memory device 4230.

The controller 4210 may control an overall operation of the memory system 4200. The controller 4210 may be configured in the same manner as the controller 2210 shown in FIG. 7.

The buffer memory device 4220 may temporarily store data to be stored in the nonvolatile memory device 4230. Further, the buffer memory device 4220 may temporarily store data read out from the nonvolatile memory device 4230. The data temporarily stored in the buffer memory device 4220 may be transmitted to the host 4100 or the nonvolatile memory device 4230 according to control of the controller 4210.

The nonvolatile memory device 4230 may be used as a storage medium of the memory system 4200.

Figure 10:
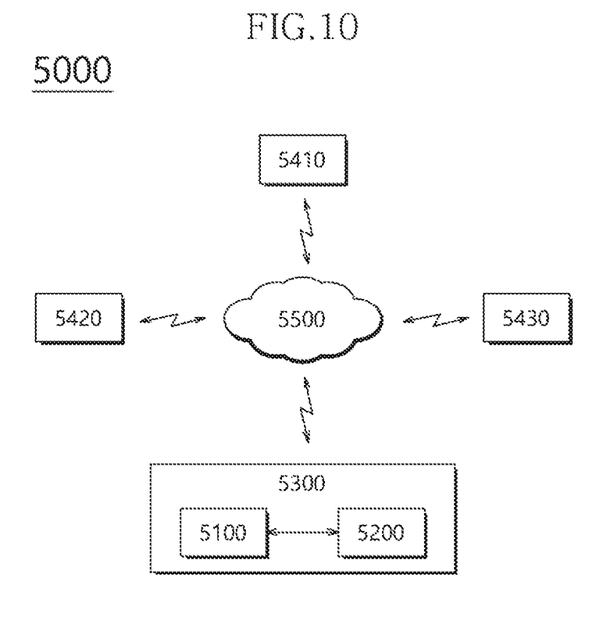
FIG. 10 is a diagram illustrating a network system including a memory system according to an embodiment of the present disclosure.

FIG. 10 is a diagram illustrating an example of a network system 5000 including a memory system according to an embodiment.

Referring to FIG. 10, the network system 5000 may include a server system 5300 and a plurality of client systems 5410 to 5430 which are coupled to each other through a network 5500.

The server system 5300 may service data in response to requests from the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host 5100 and a memory system 5200. The memory system 5200 may be configured as the memory system 10 illustrated in FIG. 1, the memory system 2200 illustrated in FIG. 6, the memory system 3200 illustrated in FIG. 8, or the memory system 4200 illustrated in FIG. 9.

Figure 11:
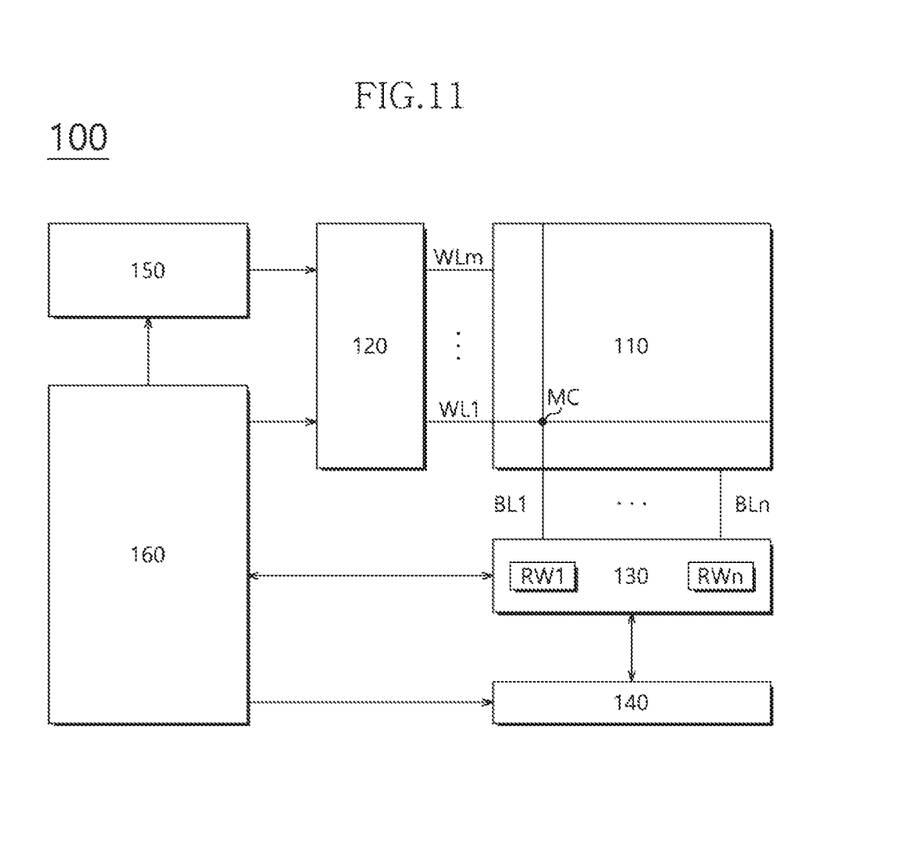
FIG. 11 is a diagram illustrating a nonvolatile memory device included in a memory system according to an embodiment of the preset disclosure.

FIG. 11 is a block diagram illustrating an example of a nonvolatile memory device included in a memory system according to the embodiment. Referring to FIG. 11, the nonvolatile memory device 100 may include the memory cell array 110, a row decoder 120, a data read/write block 130, a column decoder 140, a voltage generator 150, and a control logic 160.

The memory cell array 110 may include the memory cells MC which are arranged in regions where the word lines WL1 to WLm and the bit lines BL1 to BLn cross each other.

The row decoder 120 may be coupled with the memory cell array 110 through the word lines WL1 to WLm. The row decoder 120 may operate according to control of the control logic 160. The row decoder 120 may decode addresses provided from an external device (not shown). The row decoder 120 may select and drive the word lines WL1 to WLm, based on the decoding results. For example, the row decoder 120 may provide word line voltages provided from the voltage generator 150, to the word lines WL1 to WLm.

The data read/write block 130 may be coupled with the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as a write driver which stores data provided from the external device, in the memory cell array 110 in a write operation. In another example, the data read/write block 130 may operate as a sense amplifier which reads out data from the memory cell array 110 in a read operation.

The column decoder 140 may operate according to control of the control logic 160. The column decoder 140 may decode addresses provided from the external device. The column decoder 140 may couple data input/output lines (or data input/output buffers) with the read/write circuits RW1 to RWn of the data read/write block 130 which respectively correspond to the bit lines BL1 to BLn, based on decoding results.

The voltage generator 150 may generate voltages to be used in internal operations of the nonvolatile memory device 100. The voltages generated by the voltage generator 150 may be applied to the memory cells MC of the memory cell array 110. For example, a program voltage generated in a program operation may be applied to a word line of memory cells on which the program operation is to be performed. In another example, an erase voltage generated in an erase operation may be applied to a well region of memory cells on which the erase operation is to be performed. In still another example, a read voltage generated in a read operation may be applied to a word line of memory cells on which the read operation is to be performed.

The control logic 160 may control an overall operation of the nonvolatile memory device 100, based on control signals provided from the external device. For example, the control logic 160 may control operations of the nonvolatile memory device 100 such as read, write, and erase operations of the nonvolatile memory device 100.

The above described embodiments of the present invention are intended to illustrate and not to limit the present invention. Various alternatives and equivalents are possible. The invention is not limited by the embodiments described herein. Nor is the invention limited to any specific type of semiconductor device. In view of the present disclosure, other additions, subtractions, or modifications are apparent to one of ordinary skill in the art and are intended to fall within the scope of the appended claims.

What is claimed is:

1. A memory system comprising:
   a nonvolatile memory device; and
   a controller configured to control the nonvolatile memory device,
   wherein the nonvolatile memory device includes a first data storage region in which a memory cell stores one-bit data in a first mode and a second data storage region in which a memory cell stores two-bit or more data in a second mode,
   the controller controls the nonvolatile memory device to perform a read operation on the first data storage region and the second data storage region in the second mode,
   the controller decodes, as data of the first mode, first data read from the first data storage region through the read operation,
   the controller decodes, as data of the second mode, second data read from the second data storage region through the read operation, and
   the controller controls the nonvolatile memory device to perform the read operation on the first data storage region in the second mode by changing any one of a plurality of read voltages for reading the data of the second mode to a read voltage value for reading the data of the first mode.

2. The memory system of claim 1,
wherein the controller receives and queues a first read command for the first data storage region and a second read command for the second data storage region from a host,
wherein the controller controls the nonvolatile memory device to perform the read operation on the first and second data storage regions in a way interleaving manner based on the queued read commands, and
wherein the controller transmits the decoded first and second data to the host.

3. The memory system of claim 2, wherein the first and second data storage regions are included in different planes which share a way.

4. The memory system of claim 1, wherein the controller controls the nonvolatile memory device to perform the read operation the first data storage region only according to a read voltage closest to a read voltage for reading the data of the first mode, among the plurality of read voltages for reading the data of the second mode.

5. The memory system of claim 1, wherein the first mode is an operation mode in which a plurality of memory cells included in the first data storage region operate as a single-level cell (SLC) and the second mode is an operation mode in which a plurality of memory cells included in the second data storage region operate as at least one of a multi-level cell (MLC), a triple-level cell (TLC), and a quad-level cell (QLC).

6. A controller which controls a nonvolatile memory device, the controller comprising:
a processor configured to control the nonvolatile memory device to perform a read operation, in a second mode, on a first data storage region in which a memory cell stores one-bit data in a first mode, and a second data storage region in which a memory cell stores two-bit or more data in the second mode; and
an error correction code (ECC) engine configured to decode, as data of the first mode, first data read from the first data storage region through the read operation and decode, as data of the second mode, second data read from the second data storage region through the read operation,
wherein the processor controls the nonvolatile memory device to perform the read operation on the first data storage region in the second mode by changing any one of a plurality of read voltages for reading the data of the second mode to a read voltage value for reading the data of the first mode.

7. The controller of claim 6,
further comprising a host interface configured to perform data communication with a host,
wherein the processor receives and queues a first read command for the first data storage region and a second read command for the second data storage region, from the host, and
wherein the processor controls the nonvolatile memory device to perform the read operation on the first and second data storage regions in a way interleaving manner based on the queued read commands.

8. The controller of claim 6, wherein the first and second data storage regions are included in different planes which share a way.

9. The controller of claim 6, wherein the processor controls the nonvolatile memory device to perform the read operation on the first data storage region only according to a read voltage closest to a read voltage for reading the data of the first mode, among the plurality of read voltages for reading the data of the second mode.

10. The controller of claim 6, wherein the first mode is an operation mode in which a plurality of memory cells included in the first data storage region operate as a single-level cell (SLC), and the second mode is an operation mode in which a plurality of memory cells included in the second data storage region operate as at least one of a multi-level cell (MLC), a triple-level cell (TLC), and a quad-level cell (QLC).

11. An operating method of a memory system which includes a nonvolatile memory device and a controller configured to control the nonvolatile memory device, the method comprising:
performing, by the nonvolatile memory device, a read operation, in a second mode, on a first data storage region in which a memory cell stores one-bit data in a first mode and a second data storage region in which a memory cell stores two-bit or more data in the second mode; and
decoding, by the controller, first data read from the first data storage region through the read operation, as data of the first mode;
decoding, by the controller, second data read from the second data storage region through the read operation, as data of the second mode,
wherein the read operation is performed on the first data storage region in the second mode by changing any one of a plurality of read voltages for reading the data of the second mode to a read voltage value for reading the data of the first mode.

12. The method of claim 11, further comprising:
receiving and queuing, by the controller, a first read command for the first data storage region and a second read command for the second data storage region from a host; and
transmitting, by the controller, the decoded first and second data to the host,
wherein the read operation is performed on the first and second data storage regions in a way interleaving manner based on the queued read commands.

13. The method of claim 12, wherein the first and second data storage regions are included in different planes which share a way.

14. The method of claim 11, wherein the read operation is performed on the first data storage region only according to a read voltage closest to a read voltage for reading the data of the first mode, among the plurality of read voltages for reading the data of the second mode.

15. The method of claim 11, wherein the first mode is an operation mode in which a plurality of memory cells included in the first data storage region operate as a single-level cell (SLC), and the second mode is an operation mode in which a plurality of memory cells included in the second data storage region operate as at least one of a multi-level cell (MLC), a triple-level cell (TLC), and a quad-level cell (QLC).

16. An operating method of a controller which controls a nonvolatile memory device, the method comprising:
controlling the nonvolatile memory device to perform a read operation, in a second mode, on a first data storage region in which a memory cell stores one-bit data in a first mode, and a second data storage region in which a memory cell stores two-bit or more data in the second mode;
decoding, as data of the first mode, first data read from the first data storage region through the read operation; and decoding, as data of the second mode, second data read from the second data storage region through the read operation, wherein the controlling of the nonvolatile memory device includes controlling the nonvolatile memory device to perform the read operation on the first data storage region in the second mode by changing any one of a plurality of read voltages for reading the data of the second mode to a read voltage value for reading the data of the first mode.

17. The method of claim 16, further comprising:
receiving and queuing a first read command for the first data storage region and a second read command for the second data storage region from a host; and
transmitting the decoded first and second data to the host,
wherein the controlling of the nonvolatile memory device includes controlling the nonvolatile memory device to perform the read operation on the first and second data storage regions in a way interleaving manner based on the queued read commands.

18. The method of claim 16, wherein the first and second data storage regions are included in different planes which share a way.

19. The method of claim 16, wherein the controlling of the nonvolatile memory device includes controlling the nonvolatile memory device to perform the read operation on the first data storage region only according to a read voltage closest to a read voltage for reading the data of the first mode, among the plurality of read voltages for reading the data of the second mode.

20. The method of claim 16, wherein the first mode is an operation mode in which a plurality of memory cells included in the first data storage region operate as a single-level cell (SLC), and the second mode is an operation mode in which a plurality of memory cells included in the second data storage region operate as at least one of a multi-level cell (MLC), a triple-level cell (TLC), and a quad-level cell (QLC).

21. An operating method of a controller for controlling a memory device including a first storage region having single-level cells and a second storage region having multiple-level cells, the first and second storage regions sharing a way, the method comprising:
controlling the memory device to read out, by using one or more among plural read voltages for the multiple-level cell, first and second data respectively from the first and second regions according to a way-interleaving scheme; and
error-correcting the first data according to an error correction scheme for the single-level cell and the second data according to an error correction scheme for the multiple-level cell,
wherein the controlling includes controlling the memory device to change, to read out the first data during the read out, a selected one of the plural read voltages to a read voltage for the single-level cell, and
wherein the selected read voltage is closest, of the plural read voltages, to the read voltage for the single-level cell.

* * * * *